United States Patent
Takasu

(10) Patent No.: US 11,139,366 B2
(45) Date of Patent: Oct. 5, 2021

(54) SEMICONDUCTOR DEVICE AND METHOD OF MANUFACTURING THE SAME

(71) Applicant: ABLIC Inc., Chiba (JP)

(72) Inventor: Hiroaki Takasu, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/811,214

(22) Filed: Mar. 6, 2020

(65) Prior Publication Data

US 2020/0295124 A1 Sep. 17, 2020

(30) Foreign Application Priority Data

Mar. 13, 2019 (JP) .............................. JP2019-045337

(51) Int. Cl.
*H01L 49/02* (2006.01)
*H01L 27/08* (2006.01)
*H01L 27/01* (2006.01)
*H01L 27/02* (2006.01)

(52) U.S. Cl.
CPC ............ *H01L 28/20* (2013.01); *H01L 27/016* (2013.01); *H01L 27/0288* (2013.01); *H01L 27/0802* (2013.01)

(58) Field of Classification Search
CPC ....... H01L 28/20; H01L 28/24; H01L 27/016; H01L 27/0288; H01L 27/0629; H01L 27/0802; H01L 27/101; H01C 7/006; H01C 17/075
See application file for complete search history.

(56) References Cited

U.S. PATENT DOCUMENTS

| | | | | |
|---|---|---|---|---|
| 4,455,567 | A * | 6/1984 | Lee | ...................... H01L 27/0688 257/488 |
| 6,110,772 | A * | 8/2000 | Takada | ................ H01L 27/0635 257/E21.004 |
| 6,140,910 | A * | 10/2000 | Smith | ..................... H01L 28/20 257/E21.004 |
| 6,365,480 | B1 * | 4/2002 | Huppert | .............. H01L 27/0682 257/E21.006 |
| 6,369,409 | B1 | 4/2002 | Takasu et al. | |
| 6,566,721 | B2 | 5/2003 | Takasu | |
| 6,653,688 | B2 | 11/2003 | Takasu et al. | |
| 7,808,048 | B1 * | 10/2010 | Hill | ........................ H01L 28/20 257/358 |
| 10,879,172 | B2 * | 12/2020 | Lin | ..................... H01L 23/5228 |
| 2006/0027892 | A1 * | 2/2006 | Yamashita | ........ H01L 21/76843 257/536 |

(Continued)

FOREIGN PATENT DOCUMENTS

| | | |
|---|---|---|
| JP | H9-321229 | 12/1997 |
| JP | 2002-134697 | 5/2002 |
| JP | 2002-313927 | 10/2002 |

*Primary Examiner* — Eduardo A Rodela
(74) *Attorney, Agent, or Firm* — Crowell & Moring LLP

(57) ABSTRACT

A thin film resistor includes a high-resistance region and low-resistance regions which are formed at both ends of the high-resistance region. The high-resistance region includes first high-resistance regions and a second high-resistance region, and the first high-resistance regions are arranged at both side surfaces in a first direction in the second high-resistance region. The second high-resistance region has a higher sheet resistance than that of the first high-resistance regions.

7 Claims, 6 Drawing Sheets

(56) References Cited

U.S. PATENT DOCUMENTS

| | | | |
|---|---|---|---|
| 2012/0225535 A1* | 9/2012 | Kato | H01L 28/24 |
| | | | 438/384 |
| 2013/0069064 A1* | 3/2013 | Yoshihira | H01L 29/7811 |
| | | | 257/49 |
| 2017/0047286 A1* | 2/2017 | Basker | H01L 23/5256 |
| 2019/0305075 A1* | 10/2019 | Takasu | H01L 21/308 |
| 2019/0348494 A1* | 11/2019 | Leng | H01L 21/2855 |
| 2020/0303094 A1* | 9/2020 | Chintarlapalli Reddy | |
| | | | H01C 1/16 |

* cited by examiner

SEMICONDUCTOR DEVICE AND METHOD OF MANUFACTURING THE SAME

RELATED APPLICATIONS

This application claims priority to Japanese Patent Application No. 2019-045337 filed on Mar. 13, 2019, the entire content of which is incorporated herein by reference.

BACKGROUND OF THE INVENTION

1. Field of the Invention

The present invention relates to a semiconductor device, and more particularly, to a semiconductor device including a thin film resistor, and a method of manufacturing a semiconductor device including a thin film resistor.

2. Description of the Related Art

In an analog IC such as a voltage detector, a bleeder resistor which generally includes a plurality of polysilicon resistors is used.

For example, in the voltage detector, voltage detection is carried out in an error amplifier by comparing a reference voltage which is generated in a reference voltage circuit with a divided voltage which is divided in a bleeder resistor circuit. Accuracy of the divided voltage divided in the bleeder resistor circuit is therefore highly important. When the accuracy in voltage division by the bleeder resistor circuit is poor, an input voltage to the error amplifier varies so that a predetermined release voltage and a predetermined detection voltage cannot be obtained.

To enhance the accuracy in voltage division by the bleeder resistor circuit, various measures have been hitherto taken. For example, in Japanese Patent Application Laid-open No. H09-321229, in order to manufacture a highly accurate analog IC, potentials of conductors which are mounted on upper surfaces or lower surfaces of the polysilicon resistors are fixed for the purpose of obtaining a highly accurate voltage division ratio by resistance, so that a desired resistance (voltage division ratio) is obtained.

As illustrated in FIG. 8, a conventional bleeder resistor circuit includes a plurality of thin film resistors each of which is formed of a thin film resistor 400 having a basic configuration which includes a high-resistance region 301 and low-resistance regions 303 at both ends thereof. Since each of thin film resistors 401 to 406 of a group of thin film resistors is formed by a mask having the same width, it is expected that all the thin film resistors are formed to have the same width. In the group of thin film resistors, however, each of widths W1 and W6 tends to be reduced as compared with each of widths W2 to W5, As described above, when a processing variation occurs in each thin film resistor in a semiconductor manufacturing process, it is difficult to obtain the same resistance in the plurality of thin film resistors in the bleeder resistor circuit, and it is difficult to achieve a voltage division ratio by resistance required for an analog IC at high accuracy.

SUMMARY OF THE INVENTION

The present invention has an object to provide a highly accurate semiconductor device in which resistance variations in thin film resistors due to a processing variation are reduced and a method of manufacturing the semiconductor device.

A semiconductor device according to one embodiment of the present invention employs the following measure.

There is provided a semiconductor device including a semiconductor substrate; an insulating film formed on the semiconductor substrate; first high-resistance regions constructed from a polysilicon film, and formed on the insulating film; a second high-resistance region constructed from the polysilicon film, formed on the insulating film, and having side surfaces in a first direction, the side surfaces being sandwiched by the first high-resistance regions; and low-resistance regions constructed from the polysilicon film, formed on the insulating film, and arranged on the both ends of the first high-resistance regions and the second high-resistance region in a second direction orthogonal to the first direction, a sheet resistance of the second high-resistance region being higher than a sheet resistance of the first high-resistance regions.

Further, a method of manufacturing a semiconductor device according to another embodiment of the present invention uses the following measure.

There is provided a method of manufacturing a semiconductor device including forming a non-doped polysilicon film on an insulating film formed on a semiconductor substrate; forming a first impurity region of a first conductivity type by implanting impurities into the non-doped polysilicon film in a first ion implantation; forming a silicon oxide film on the polysilicon film; forming a first resist pattern on the silicon oxide film, and etching the silicon oxide film by using the first resist pattern as a mask; forming second impurity regions of the first conductivity type having a higher concentration than a concentration of the first impurity region, in the polysilicon film by performing a second ion implantation using, as a mask, the first resist pattern and the silicon oxide film, in a larger dose amount than a dose amount of the first ion implantation; forming third impurity regions of the first conductivity type by performing a first heat treatment to diffuse impurities in the second impurity regions toward the first impurity region after the first resist pattern is removed; forming fourth impurity regions of the first conductivity type having a higher concentration than a concentration of the third impurity regions, in the polysilicon film by performing a third ion implantation using, as a mask, a second resist pattern formed on the polysilicon film; etching the polysilicon film by using, as a mask, a third resist pattern formed on the polysilicon film to cover the fourth impurity regions after the second resist pattern is removed; and forming a thin film resistor including first high-resistance regions, a second high-resistance region, and low-resistance regions by performing a second heat treatment on the polysilicon film including the first impurity region, the third impurity regions, and the fourth impurity regions.

With the use of the measures described above, in a bleeder resistor circuit having thin film resistors, variations in resistance of the thin film resistors can be reduced, and a highly accurate semiconductor device can be obtained.

DETAILED DESCRIPTION OF THE PREFERRED EMBODIMENTS

Description is now given of embodiments of the present invention with reference to the accompanying drawings.

Figure 1A:
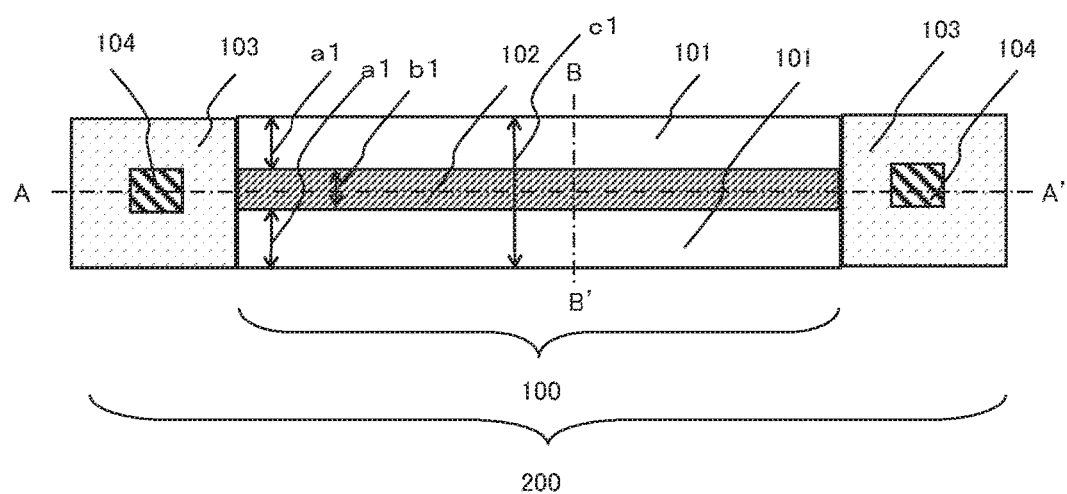
FIG. 1A is a plan view of a thin film resistor of a semiconductor device according to the first embodiment of the present invention.
Figure 1B:
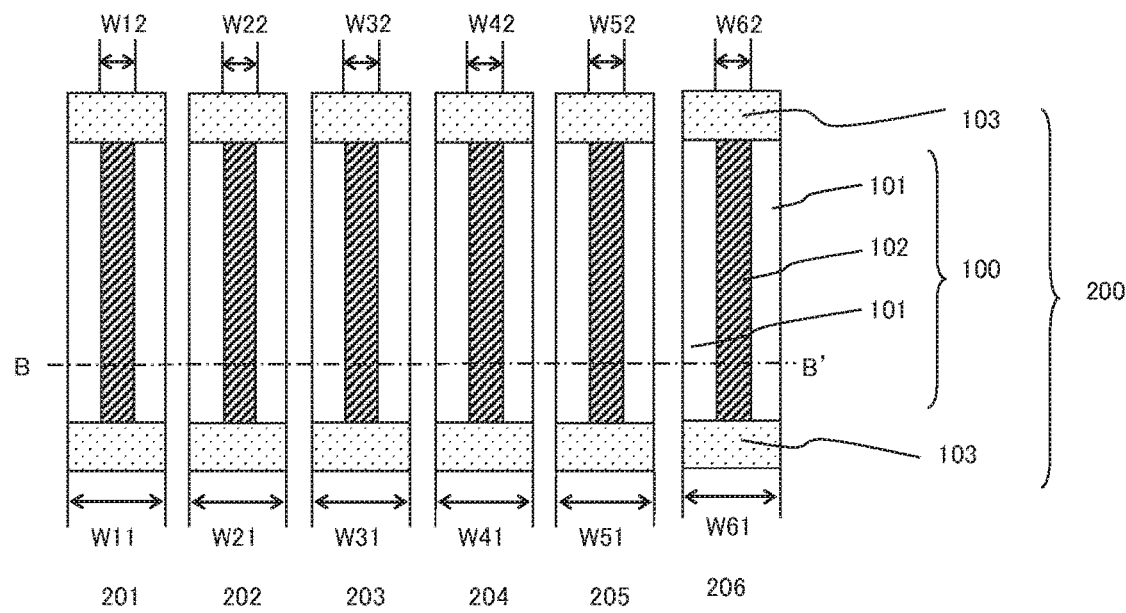
FIG. 1B is a plan view of a group of thin film resistors of the semiconductor device according to the first embodiment.

FIG. 1A is a plan view of a thin film resistor of a semiconductor device according to the first embodiment of the present invention, and FIG. 1B is a plan view of a group of thin film resistors of the semiconductor device according to the first embodiment. A basic configuration of a thin film resistors 200 include a high-resistance region 100 and low-resistance regions 103 which are arranged at both ends of the high-resistance region 100. The high-resistance region 100 includes first high-resistance regions 101 and a second high-resistance region 102, and the first high-resistance regions 101 are arranged to be in contact with both ends of the second high-resistance region 102 which is formed in a rectangular shape, and are arranged in a transverse direction (first direction, B-B' direction) of the second high-resistance region 102. In a longitudinal direction (second direction, A-A' direction) orthogonal to the transverse direction, the first high-resistance regions 101 have the same length as that of the second high-resistance region 102, and both end surfaces of the first high-resistance regions 101 in the longitudinal direction are flush with corresponding end surfaces of the second high-resistance region 102 in the longitudinal direction to form substantially flat planes. The low-resistance regions 103 are in contact with the flat planes, that is, with both ends of the high-resistance region 100 in the longitudinal direction.

The first high-resistance regions 101, the second high-resistance region 102, and the low-resistance regions 103 are thin films made from the same layer of a polysilicon film by introducing P-type impurities, for example, boron. An interlayer insulating film is formed to cover the surface of the thin film resistor 200 and contact holes 104 are formed in the interlayer insulating film through which the low-resistance regions 103 are partially exposed. The contact holes 104 are used for electrical connection to other resistors, internal circuits, or the like by metal lines.

The second high-resistance region 102 is formed to have a sheet resistance higher than that of the first high-resistance regions 101 by adjusting impurity concentration. To achieve the following advantageous effects more evidently, it is preferable that the sheet resistance of the second high-resistance region 102 is 10 times or more as high as the sheet resistance of the first high-resistance regions 101. For example, when the sheet resistance of the first high-resistance regions 101 is 5 kΩ/sq, the sheet resistance e of the second high-resistance region 102 is set to be 50 kaΩ/sq or more.

Further, introducing N-type impurities such as phosphorus and arsenic instead of P-type impurities, for example, boron to the first high-resistance regions 101 and the second high-resistance region 102 polysilicon thin film resistors having an N-type conductivity may be formed. In addition, to further increase the sheet resistance of the second high-resistance region 102, the second high-resistance region 102 may be constructed from a non-doped polysilicon thin film.

A plurality of thin film resistors each of which has been described above are combined to form a bleeder resistor circuit.

According to the embodiment illustrated in FIG. 1A and FIG. 1B, even if the processing variation in the thin film resistors 200 occurs in the manufacturing process for the semiconductor, the variation in resistance of the entire thin film resistor can be suppressed to be small, since a portion at which the processing variation occurs is the second high-resistance region 102 having a higher sheet resistance.

The resistance of the entire thin film resistor is defined by a combination of the first high-resistance regions 101 and the second high-resistance region 102. The sheet resistance of the second high-resistance region 102 is set, for example, 10 times or more as high as the sheet resistance of the first high-resistance regions 101. Even if the width of the second high-resistance region 102 varies to some extent due to the processing variation, the influence of the variation is reduced to one tenth or less as compared with the case in which the entire thin film resistor is constructed from only one high-resistance region as shown in FIG. 8.

Figure 8:
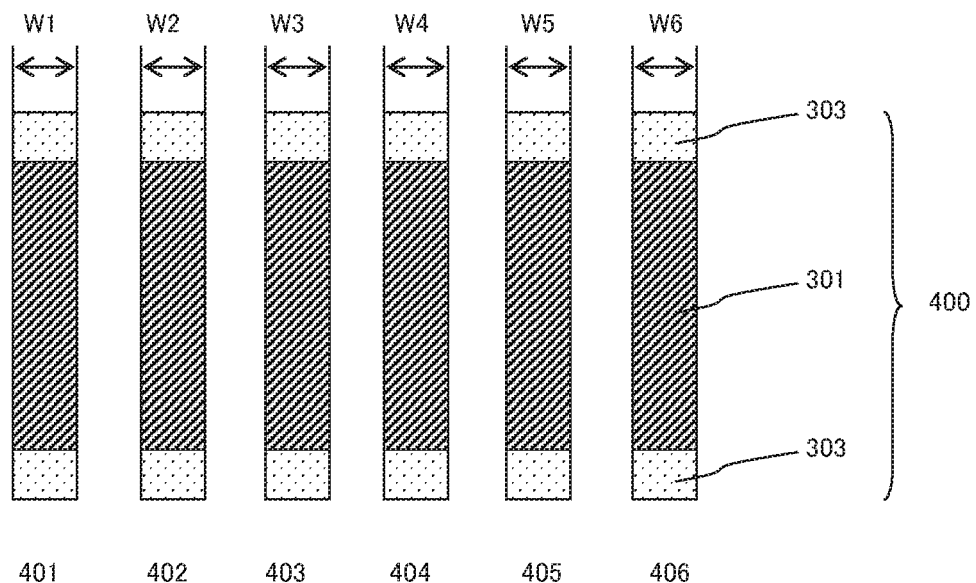
FIG. 8 is a plan view of a group of thin film resistors of a semiconductor device in related art.

Now, the processing variation in the thin film resistors according to the semiconductor device of the present invention is described as compared with the conventional thin film resistors illustrated in FIG. 8. The widths of the group of thin film resistors 401 to 406 are determined by a photolithography process and an etching process, and it has already been described that each of the widths W1 and W6 is narrower than each of the widths W2 to W5. A factor of the difference in width is a generation of development-accelerating species during development in the photolithography process. When a resist pattern is formed through use of a positive resist, an exposed region is removed with an alkali developing solution (for example, TMAH). At this time, since the alkali developing solution which includes dissolved resist generates development-accelerating species acting to promote the development, a resist pattern for forming the thin film resistors 401 and 406 located at the both ends in the group of thin film resistors is narrower than a resist pattern for forming the thin film resistors 402 to 405. This is because there is a developing region having a large area on one side of the resist pattern for forming the thin film resistors 401 and 406, while there are developing regions having a small area on both sides of the resist pattern for forming the thin film resistors 402 to 405.

As described above, the processing variation occurs because the developing area around each thin film resistor is not the same. To suppress the processing variation, the applicant of the present invention therefore proposes a configuration illustrated in FIG. 1B.

A thin film resistors 201 to 206 are arranged adjacent to each other, and an outer periphery (outer circumference) of each of the thin film resistors 201 to 206 is formed by the photolithography process and the etching process. A pattern used to define the outer periphery of each of the thin film resistors 201 to 206 is formed by the photolithography process and the etching process, and width variations in widths W11 to W61 in a B-B' direction, or in width c1 of the high-resistance region 100 illustrated in FIG. 1A are the same as the variations in the conventional thin film resistors.

However, a width a1 of each first high-resistance region 101 located at an outer side of the high-resistance region 100 is determined in accordance with a diffusion width of impurities that are introduced by, for example, ion implantation into regions outside a silicon oxide film formed as a mask on the surface of each of the thin film resistors 201 to 206, and then diffused toward the inside thereof in a subsequent heat treatment process, so that the width a1, the shape, and the size of each first high-resistance region 101 can be the same in all the thin film resistors 201 to 206. Therefore, a processing variation such as larger or smaller widths of the thin film resistors 201 to 206 can be cancelled out by changing the width b1 of the second resistance region 102 located at the inner side of the high-resistance region 100.

The resistance of each first high-resistance region 101 is set smaller than that of the second high-resistance region 102. Thus, the main factor for determining the resistance of the high-resistance region 100 is the width a1 of each first high-resistance region 101. As described above, the width a1 of each first high-resistance region 101 can be substantially the same in the group of thin film resistors 200, so that resistance variations resulting from a processing variation of the thin film resistors 200 can be reduced.

Figure 2:
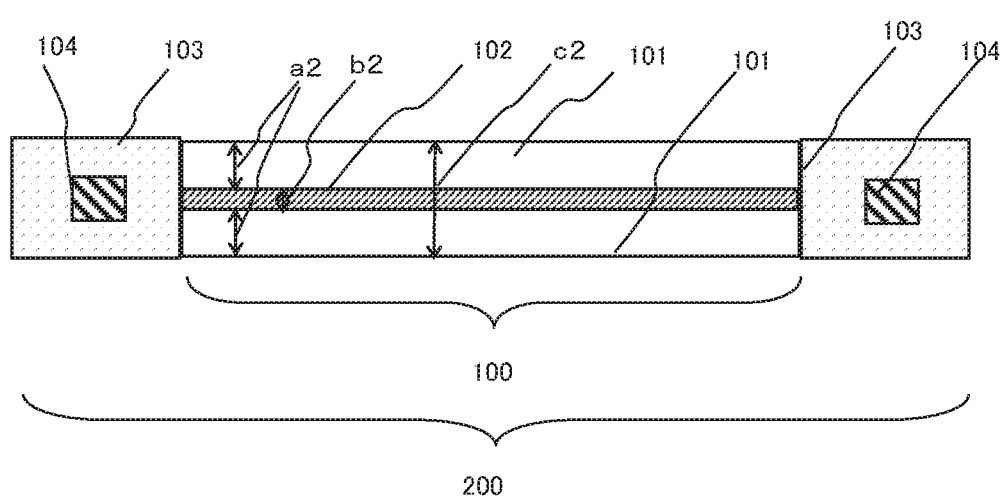
FIG. 2 is a plan view of a thin film resistor of a semiconductor device according to the first embodiment of the present invention.

In FIG. 2, the group of thin film resistors 200 has a reduced width due to a processing variation as compared with that in the first embodiment as illustrated in FIG. 1A and FIG. 1B.

As described above, the processing variation in the group of thin film resistors 200 is cancelled out by changing the width of the second high-resistance region 102. Thus, the width b2 of the second high-resistance region 102 becomes smaller than that in the first embodiment as illustrated in FIG. 1A and FIG. 1B. In contrast, the width a2 of each first high-resistance region 101 is the same as the width a1 of each first high-resistance region 101 in the first embodiment as illustrated in FIG. 1A and FIG. 1B.

The resistance of the entire thin film resistor is defined by a combination of the first high-resistance regions 101 and the second high-resistance region 102. The sheet resistance of the second high-resistance region 102 is set to be 10 times or more as high as the sheet resistance of the first high-resistance regions 101. As illustrated in FIG. 2, even if the width b2 of the second high-resistance region 102 is reduced due to the processing variation, an influence caused by the reduction in width of the second high-resistance region 102 can therefore be suppressed to be smaller than the conventional thin film resistor in which the entire thin film resistor is formed of only one high-resistance region.

For example, in conventional thin film resistor, when the entire thin film resistor is formed of the second high-resistance region 102 having a width of 1 μm, and the width is reduced by 0.1 μm due to the processing variation, the difference in resistance is as much as 10% between the thin film resistor with reduction in width and the thin film resistor without reduction in width.

Meanwhile, according to the embodiment described above, in a case where the thin film resistor is formed by the second high-resistance region 102 having a width of 1 μm and the first high-resistance regions 101 each also having a width of 1 μm so as to cover the side surfaces of the second high-resistance region 102, even if the width of the thin film resistor is locally reduced by 0.1 μm due to the variation in manufacturing process, only the second high-resistance region 102 is reduced in width. Since the sheet resistance of the second high-resistance region 102 is 10 times or more as high as the sheet resistance of the first high-resistance regions 101, the difference in resistance between the thin film resistor with reduction in width and the thin film resistor without reduction in width can be greatly suppressed to 1% or less.

Figure 3A:
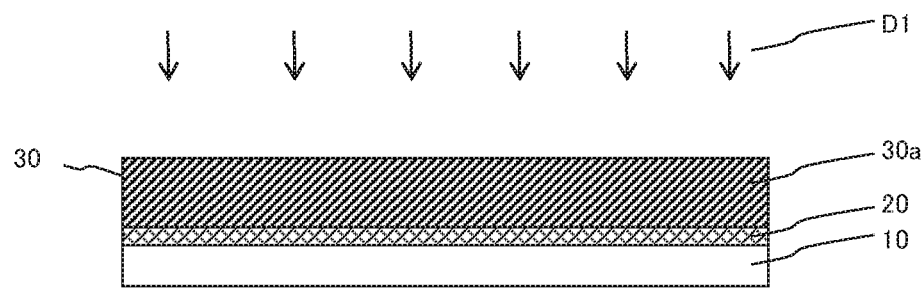
FIG. 3A, FIG. 3B, and FIG. 3C are sectional views for illustrating manufacturing processes for the thin film resistor of the semiconductor device according to the first embodiment of the present invention.
Figure 3B:
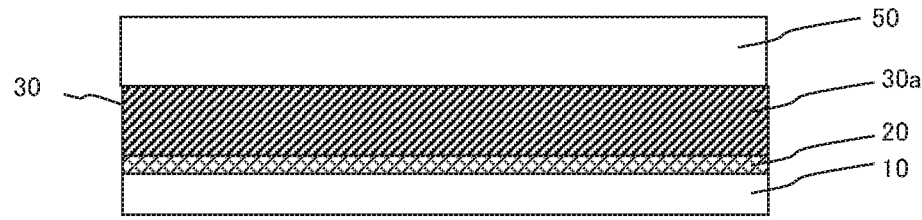
Figure 3C:
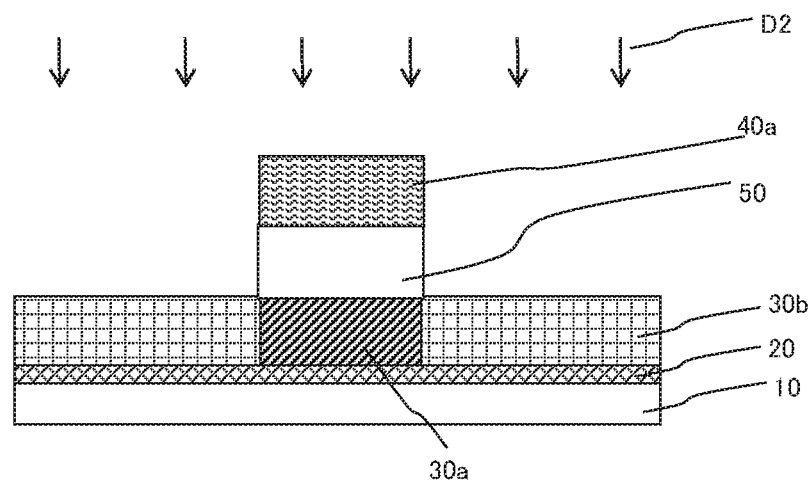
Figure 4A:
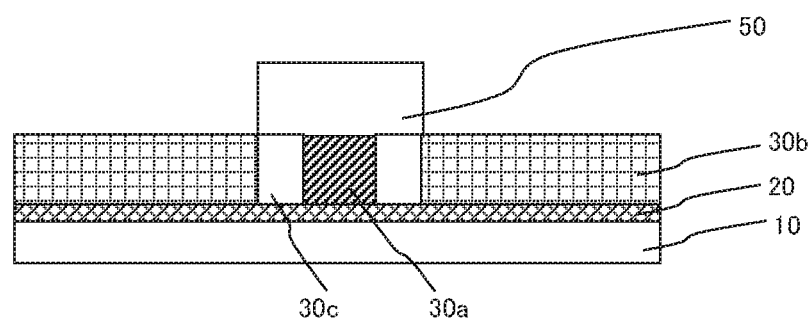
FIG. 4A and FIG. 4B are sectional views for illustrating manufacturing processes for the thin film resistor of the semiconductor device according to the first embodiment of the present invention after the manufacturing process of FIG. 3C.
Figure 4B:
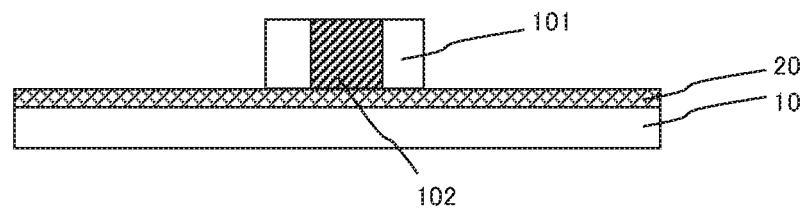
Figure 5:
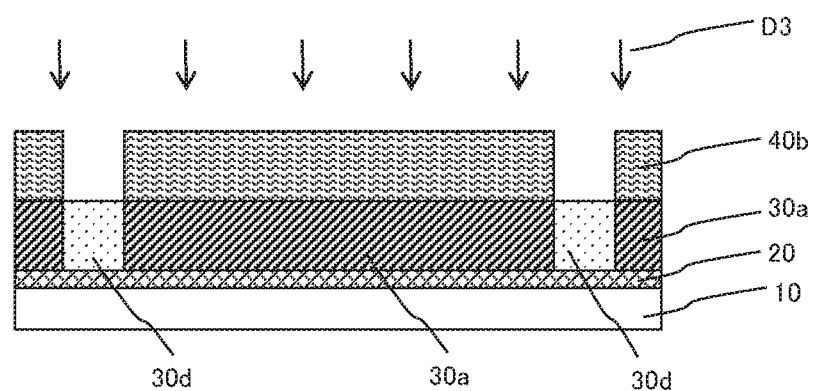
FIG. 5 is a sectional view for illustrating a manufacturing process for the thin film resistor of the semiconductor device according to the first embodiment of the present invention.

FIG. 3A to FIG. 5 are sectional views for illustrating manufacturing processes for the thin film resistor of the semiconductor device according to the first embodiment of the present invention. FIG. 3A to FIG. 4B are sectional views taken along the transverse direction (B-B' direction) of FIG. 1A. FIG. 5 is a sectional view taken along the longitudinal direction (A-A' direction) of FIG. 1A.

As illustrated in FIG. 3A, an insulating film 20 having a thickness of from 2,000 Å to 8,000 Å is deposited on a semiconductor substrate 10, and then, a non-doped polysilicon film 30 having a thickness of from 500 Å to 2,000 Å is further deposited. Next, P-type impurities, for example, BF2 are ion-implanted (ion implantation D1) into the polysilicon film 30 to form a first impurity region 30a. When the first impurity region 30a is a non-doped polysilicon film, the ion implantation D1 may be omitted.

Next, as illustrated in FIG. 3B, a silicon oxide film 50 having a thickness of from about 1,000 Å to about 5,000 Å is formed on the polysilicon film 30.

Subsequently, as illustrated in FIG. 3C, after a resist pattern 40a is formed on the silicon oxide film 50, the silicon oxide film 50 is etched through use of the resist pattern 40a as a mask.

Next, P-type impurities, for example, BF2 are ion-implanted (ion implantation D2) through use of the resist pattern 40a and the silicon oxide film 50 etched into a desired shape as a mask, to thereby form second impurity regions 30b. The second impurity regions 30b are formed to have a higher impurity concentration than that of the first impurity region 30a, Subsequently, after the resist pattern 40a is removed, as illustrated in FIG. 4A, a first heat treatment process is performed to diffuse the impurities in the second impurity regions 30b toward the first impurity region 30a below the silicon oxide film 50, that is, to the inside of the high-resistance region, to thereby form third impurity regions 30c. Next, as illustrated in FIG. 4B, after the second impurity regions 30b of the polysilicon film 30 are etched through use of the silicon oxide film 50 as a mask, the silicon oxide film 50 is removed, to thereby achieve a planar shape of the high-resistance region 100 including the first high-resistance regions 101 formed of the third impurity regions 30c and the second high-resistance region 102 formed of the first impurity region 30a. The second high-resistance region 102 is sandwiched by the first high-resistance regions 101 at both ends thereof.

Next, as illustrated in FIG. 5, a resist pattern 40b is formed to expose regions to be the low-resistance regions 103 of FIG. 1A and FIG. 1B, and P-type impurities, for example, BF2 are ion-implanted (ion implantation D3) into the polysilicon film 30 to form fourth impurity regions 30d, The impurities introduced at this time have a much higher concentration than that of the impurities introduced in the previous ion-implantation D2, and a dose amount at the time of implantation is from 3E15 atoms/cm$^2$ to 6E15 atoms/cm$^2$.

Next, after the resist pattern 40b is removed, a resist pattern is formed to cover the high-resistance region 100 and the low-resistance regions 103 as illustrated in FIG. 1A and FIG. 1B. This resist pattern is formed to form the low-resistance regions 103, and hence an oversized resist pattern is formed on the high-resistance region 100 corresponding to the first impurity region 30a and the third impurity regions 30c so as to prevent the high-resistance region 100 having the defined planar shape from etching damage. Subsequently, after the polysilicon film 30 is etched through use of the resist pattern as a mask, the resist pattern is removed. With this process, a planar shape of the low-resistance regions 103 formed of the fourth impurity regions 30d is defined. Further, a second heat treatment process is performed to activate the impurities in the polysilicon film 30, so that the first impurity region 30a, the third impurity regions 30c, and the fourth impurity regions 30d serve as the first high-resistance region, the second high-resistance regions, and the low-resistance regions, respectively.

The first heat treatment process described above is for diffusing the impurities, and the second heat treatment process is merely for activating the ion-implanted impurities. Thus, a large amount of heat is applied to the polysilicon film 30 during the first heat treatment process compared with that in the second heat treatment process. In general, the first heat treatment process requires higher temperature and also longer treatment time than the second heat treatment process. However, in a case where the first heat treatment process and the second heat treatment process are executed through use of a furnace and a lamp annealing apparatus (rapid thermal annealing apparatus: RTA), respectively, the second heat treatment process may require higher temperature and take much shorter treatment time than the first heat treatment process. Through those processes, the group of thin film resistors 200 each including the first high-resistance regions 101, the second high-resistance region 102, and the low-resistance regions 103 is completed. The sheet resistance of each portion forming the thus-obtained group of thin film resistors 200 is in the descending order of the second high-resistance region 102, the first high-resistance regions 101, and the low-resistance regions 103. The planar structure thereof is as illustrated in FIG. 1A.

In the above description, an example of forming the P-type resistor has been described. However, when an N-type resistor is formed, phosphorus or arsenic may be selected as ion species.

Figure 6:
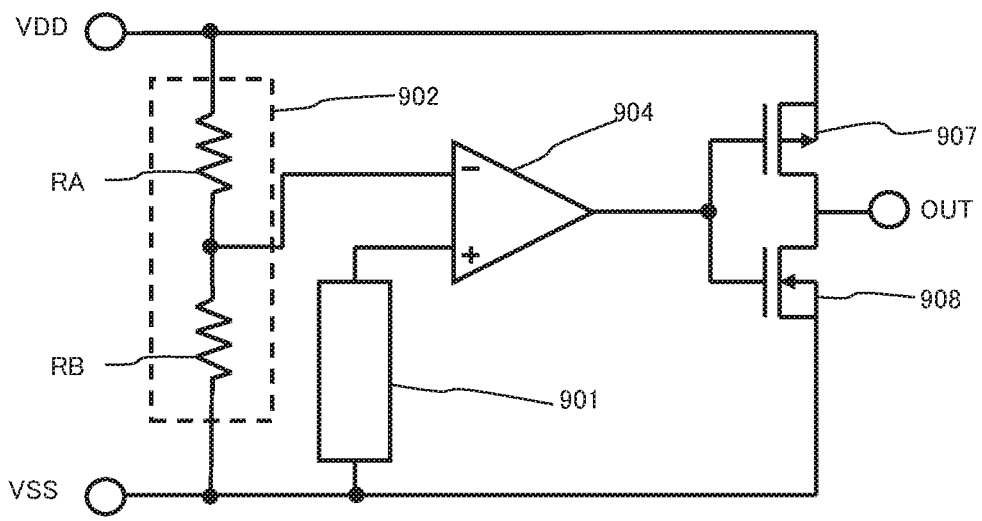
FIG. 6 is a block diagram for illustrating an example of a voltage detector using a bleeder resistor circuit constructed from the thin film resistors according to the present invention.

FIG. 6 is an example of a block diagram for illustrating a voltage detector using a bleeder resistor circuit constructed from the thin film resistors according to embodiments of the present invention.

The bleeder resistor circuit having a highly accurate voltage division ratio which is formed of the plurality of thin film resistors illustrated in FIG. 1A, FIG. 1B, and FIG. 2 according to the embodiments of the present invention is used so that highly accurate semiconductor devices such as a voltage detector, a voltage regulator, and the like can be provided.

In the example illustrated in FIG. 6, a simple circuit is illustrated for simplicity, but an actual product may have additional functions as required. Basic circuit components of the voltage detector are a reference voltage circuit 901, a bleeder resistor circuit 902, and an error amplifier 904, and an N-type transistor 908, a P-type transistor 907, and the like are additionally arranged. An operation of the voltage detector is briefly and partially described below.

An inverting input of the error amplifier 904 is a divided voltage Vr, which is divided by the bleeder resistor circuit 902, that is, RB/(RA+RB)×VDD. A reference voltage Vref of the reference voltage circuit 901 is set to be equal to the divided voltage Vr obtained when a power supply voltage VDD is a predetermined detection voltage Vdet. That is, Vref=RB/(RA+RB)×Vdet. When the power supply voltage VDD is equal to or higher than the predetermined voltage Vdet, an output of the error amplifier 904 is designed to be LOW. The P-type transistor 907 is thus turned on and the N-type transistor 908 is turned off, and the power supply voltage VDD is supplied to an output OUT. Then, when the power supply voltage VDD decreases to be equal to or lower than the detection voltage Vdet, VSS is supplied to the output OUT.

Thus, in the basic operation, the reference voltage Vref which is generated in the reference voltage circuit 901 is compared with the divided voltage Vr which is divided by the bleeder resistor circuit 902 in the error amplifier 904. The accuracy in the divided voltage Yr divided by the bleeder resistor circuit 902 thus becomes extremely important. When the bleeder resistor circuit 902 has poor accuracy in voltage division, the input voltage to the error amplifier 904 varies and a predetermined release voltage and a predetermined detection voltage cannot be obtained. High accuracy voltage division becomes possible by using the bleeder resistor circuit constructed from the thin film resistors according to the embodiments of the present invention, a product yield as an IC can be improved and a more accurate voltage detector can be manufactured.

Figure 7:
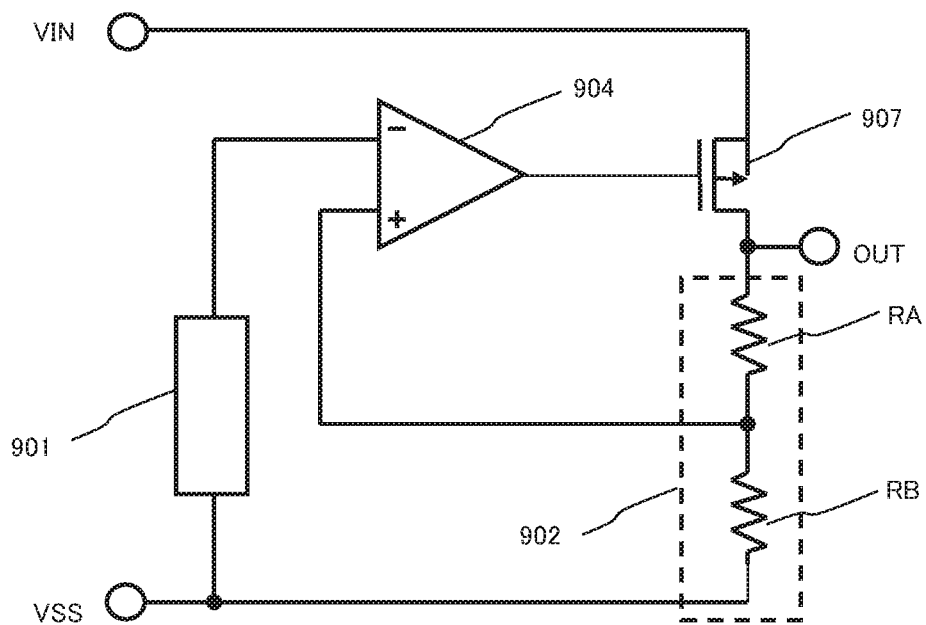
FIG. 7 is a block diagram for illustrating an example of a voltage regulator using a bleeder resistor circuit constructed from the thin film resistors according to the present invention.

FIG. 7 is an example of a block diagram for illustrating a voltage regulator using the bleeder resistor circuit constructed from the thin film resistors according to the embodiments of the present invention.

In the example illustrated in FIG. 7, a simple circuit is illustrated for simplicity, but an actual product may have additional functions as required. Basic circuit components of the voltage regulator are the reference voltage circuit 901, the bleeder resistor circuit 902, the error amplifier 904, the P-type transistor 907 acting as a current control transistor, and the like. An operation of the voltage regulator is briefly and partially described below.

The error amplifier 904 compares the divided voltage Yr divided by the bleeder resistor circuit 902 with the reference voltage Vref generated in the reference voltage circuit 901, and applies to the P-type transistor 907 a gate voltage required for obtaining a constant predetermined output voltage VOUT which is independent of a change in the input voltage VIN. In the voltage regulator as well as the voltage detector described with reference to FIG. 6, in the basic operation, the reference voltage Vref generated in the reference voltage circuit 901 is compared with the divided voltage Yr divided by the bleeder resistor circuit 902 in the error amplifier 904. The accuracy in the divided voltage Yr divided by the bleeder resistor circuit 902 thus becomes extremely important. When the bleeder resistor circuit 902 has poor accuracy in voltage division, the input voltage to the error amplifier 904 varies and the constant predetermined output voltage Vout cannot be obtained. High accuracy voltage division becomes possible by using the bleeder resistor circuit constructed from the thin film resistors according to the embodiments of the present invention, a product yield as an IC can be improved and a more accurate voltage regulator can be manufactured.

As described above, with the use of the thin film resistor in the present invention, in a manufacturing process for a semiconductor, even if a processing variation in the thin film resistor occurs, the portion suffered from the processing variation is the first high-resistance regions, and hence the resistance variations of the thin film resistor can be suppressed to be small.

What is claimed is:

1. A semiconductor device, comprising:
a semiconductor substrate;
an insulating film formed on the semiconductor substrate;
first high-resistance regions constructed from a polysilicon film formed on the insulating film;
a second high-resistance region constructed from the polysilicon film formed on the insulating film, and having side surfaces in a first direction, the side surfaces being sandwiched by the first high-resistance regions; and
low-resistance regions constructed from the polysilicon film, formed on the insulating film, and arranged on both ends of the first high-resistance regions and the second high-resistance region in a second direction orthogonal to the first direction,
a sheet resistance of the second high-resistance region being higher than a sheet resistance of the first high-resistance regions.

2. The semiconductor device according to claim 1, wherein the sheet resistance of the second high-resistance region is 10 times or more as high as the sheet resistance of the first high-resistance regions.

3. The semiconductor device according to claim 2, wherein the first high-resistance regions and the second high-resistance region are constructed from the polysilicon film into which impurities of a first conductivity type are introduced.

4. The semiconductor device according to claim 2, wherein the first high-resistance regions and the second high-resistance region are constructed from the polysilicon film into which impurities of a second conductivity type are introduced.

5. The semiconductor device according to claim 1, wherein the first high-resistance regions and the second high-resistance region are constructed from the polysilicon film into which impurities of a first conductivity type are introduced.

6. The semiconductor device according to claim 1, wherein the first high-resistance regions and the second high-resistance region are constructed from the polysilicon film into which impurities of a second conductivity type are introduced.

7. The semiconductor device according to claim 1, wherein the second high-resistance region is constructed from a non-doped polysilicon film, and the first high-resistance regions are formed of the polysilicon film into which impurities of one of a first conductivity type and a second conductivity type are introduced.

* * * * *